(12) United States Patent
Sarma et al.

(10) Patent No.: US 7,316,942 B2
(45) Date of Patent: Jan. 8, 2008

(54) FLEXIBLE ACTIVE MATRIX DISPLAY BACKPLANE AND METHOD

(75) Inventors: Kalluri R. Sarma, Mesa, AZ (US); Charles Chanley, Scottsdale, AZ (US)

(73) Assignee: Honeywell International, Inc., Morristown, NJ (US)

( * ) Notice: Subject to any disclaimer, the term of this patent is extended or adjusted under 35 U.S.C. 154(b) by 437 days.

(21) Appl. No.: 11/058,062

(22) Filed: Feb. 14, 2005

(65) Prior Publication Data

US 2006/0180815 A1  Aug. 17, 2006

(51) Int. Cl.
*H01L 21/00* (2006.01)

(52) U.S. Cl. .............................. 438/149; 257/E21.372
(58) Field of Classification Search ............... 438/149; 257/E21.372
See application file for complete search history.

(56) References Cited

U.S. PATENT DOCUMENTS

| 5,776,803 | A | 7/1998 | Young |
| 2001/0022387 | A1 | 9/2001 | Sano et al. |
| 2001/0029069 | A1 | 10/2001 | Yamazaki et al. |
| 2002/0090776 | A1 | 7/2002 | Nakata et al. |
| 2004/0069751 | A1 | 4/2004 | Yamazaki et al. |
| 2004/0263742 | A1 | 12/2004 | Kim |

FOREIGN PATENT DOCUMENTS

WO    WO 99/17155    4/1999

OTHER PUBLICATIONS

K. R. Sarma, C. Chanley, S. Dodd, J. Roush, J. Schmidt, G. Srdanov, M. Stevenson, R. Wessel, J. Innocenzo, G. Yu, M. O'Regan, W. A. MacDonald, R. Eveson, K. Long, H. Gleskova, S. Wagner, J. C. Sturm, Active Matrix OLED Using 150° C a-Si TFT Backplane Built on Flexible Plastic Substrate, Presented at SPIE Symp. On Aerospace/Defense Sensing, Orlando, FL, Apr. 2003, and to be published in SPIE Proc. vol. 5080, paper 24 (2003).
PCT International Search.
Report PCT/US2006/00088, Jul. 24, 2006.

*Primary Examiner*—Scott B. Geyer
*Assistant Examiner*—Elias Ullah
(74) *Attorney, Agent, or Firm*—Ingrassia Fisher & Lorenz

(57) ABSTRACT

An active matrix display backplane is formed by annealing a flexible dielectric substrate, and then forming one or more thin-film-transistors (TFTs), one or more pixel electrodes, and an interconnect on a surface of the annealed substrate. The interconnect includes individual, spaced apart electrodes that are electrically coupled to one another. One of the interconnect electrodes is electrically coupled to a TFT, and the other interconnect electrode is electrically coupled to the pixel electrode, to thereby electrically interconnect the TFT and the pixel electrode.

27 Claims, 7 Drawing Sheets

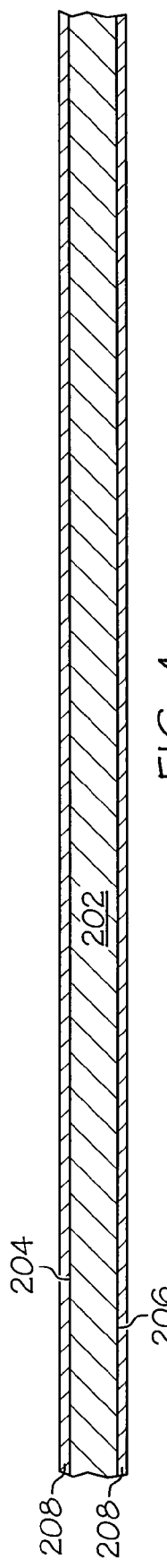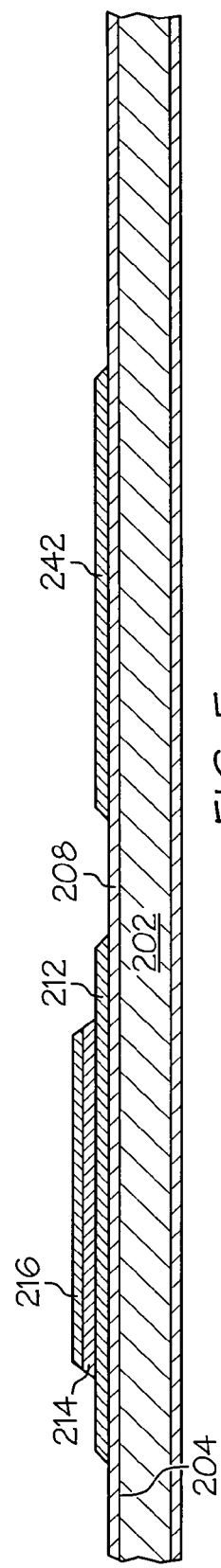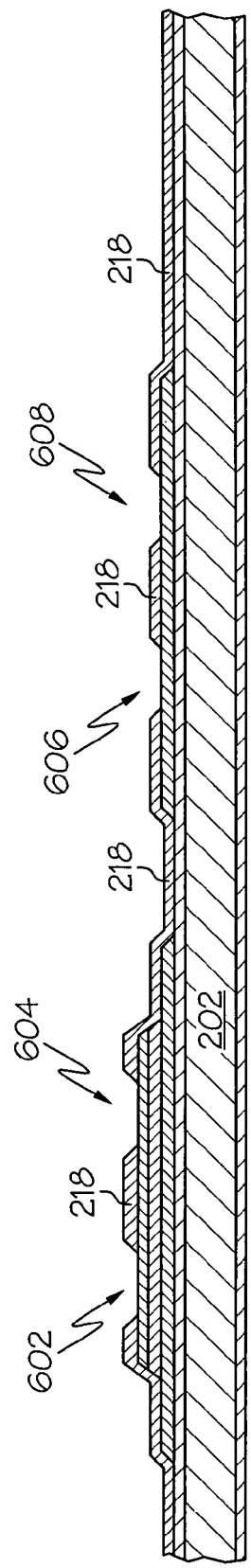

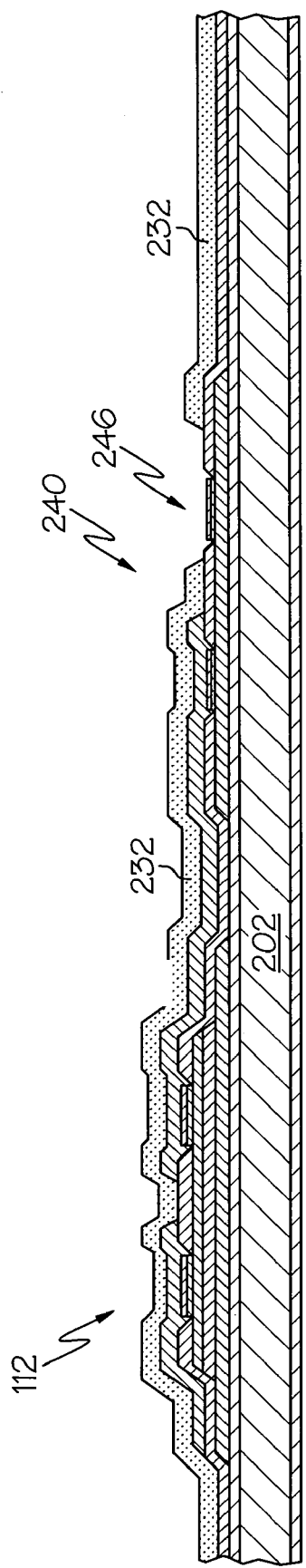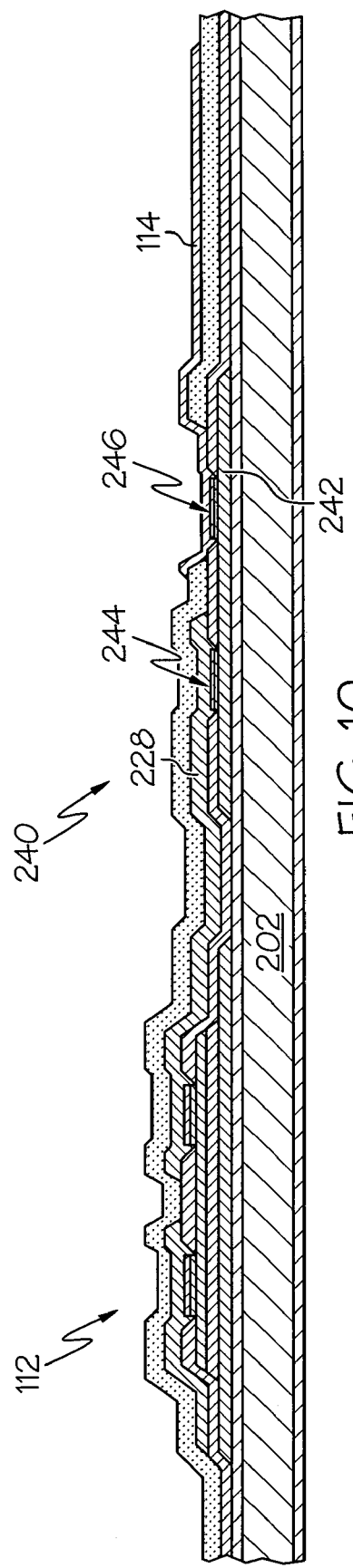

FLEXIBLE ACTIVE MATRIX DISPLAY BACKPLANE AND METHOD

FIELD OF THE INVENTION

The present invention generally relates to active matrix displays and, more particularly, to a method of forming thin-film-transistor (TFT) displays backplane directly on a flexible substrate.

BACKGROUND

Presently, there is an increasing interest in developing flexible AM (active matrix) displays for both military and commercial applications. This is at least partially because active matrix display technology provides the potential to realize relatively rugged, full color, lightweight, low power, and low cost flexible displays. Currently, most active matrix displays use rigid glass substrates. Many of these rigid active matrix displays have been, and continue to be, in commercial use in a variety of applications and sizes. For example, relatively small size (e.g., ~2-inch diagonal) displays have been used in some digital cameras and mobile phones. Relatively large size (e.g., >~15-inch diagonal) active matrix displays have been used in various other consumer products including, for example, personal computers (PCs) and televisions (TVs).

Although rigid active matrix displays are generally reliable and robust, flexible active matrix displays offer certain potential advantages. For example, flexible active matrix displays may enable many unique display applications, due to the inherent ruggedness and unique form factors of conformability and rollability during use, transportation, and storage. Flexible displays may also be amenable to roll-to-roll manufacturing processes, which may provide significant reduction in manufacturing costs.

Unfortunately, the current processes for fabricating active matrix displays typically are not adequate for the fabrication of active matrix displays using flexible plastic substrates. This is due, at least in part, to the flexible substrate having a CTE (coefficient of thermal expansion) that is significantly larger (~20 ppm versus ~3 ppm) than the typical thin films that are used to form thin-film-transistors (TFTs) on the substrate. As a result, thermal stresses may arise, which can lead to curling and warping of the flexible substrate during processing. In most instances, it is not be possible to conduct the various photolithography operations on curled and warped substrates, thereby making it rather difficult, if not impossible, to process the substrate to completion. Moreover, the flexible substrates may shrink during various TFT processing operations, resulting in dimensional instability that may make layer to layer alignment fairly difficult.

Hence, there is a need for a method of fabricating an active matrix display backplane directly on a flexible substrate that does not cause significant thermal stresses in the substrate during TFT processing and/or is relatively dimensionally stable. The present invention addresses one or more of these needs.

BRIEF SUMMARY

The present invention provides a TFT display backplane in which the TFTs and pixel electrodes are formed directly on a flexible substrate. In one embodiment, and by way of example only, a method of forming an active matrix display backplane on a flexible dielectric substrate includes forming a gate layer on a surface of the flexible dielectric substrate, forming a gate dielectric layer over the gate layer, forming an amorphous silicon (a-Si) layer over at least a portion of the gate dielectric layer, forming an inter-metal dielectric layer over the a-Si layer, selectively removing portions of the inter-metal dielectric layer over the a-Si layer, selectively removing portions of the inter-metal dielectric layer to thereby expose at least a source contact region and a drain contact region on the a-Si layer, forming a source contact in the source contact region, and forming a drain contact in the drain contact region.

In another exemplary embodiment, a method of electrically interconnecting a thin-film-transistor (TFT) and a pixel electrode formed on a substrate includes forming a conductive material layer on the substrate, forming an interconnect contact and a pixel electrode contact on the conductive material layer, electrically coupling the TFT to the interconnect contact, and electrically coupling the pixel electrode to the pixel electrode contact.

In yet another exemplary embodiment, an active matrix display backplane includes an annealed flexible dielectric substrate, a thin-film-transistor (TFT), a pixel electrode, and an interconnect. The annealed flexible dielectric substrate has at least a first surface and a second surface. The TFT is formed on the annealed flexible dielectric substrate first surface. The pixel electrode is formed on the annealed flexible dielectric substrate first surface. The interconnect is formed on the annealed flexible dielectric substrate, and includes a conductor, an interconnect contact, and a pixel electrode contact. The interconnect contact and pixel electrode contact are formed on the conductor. The interconnect contact is electrically coupled to the TFT, and the pixel contact is electrically coupled to the pixel electrode.

BRIEF DESCRIPTION OF THE DRAWINGS

The present invention will hereinafter be described in conjunction with the following drawing figures, wherein like numerals denote like elements, and wherein:

FIGS. 3-11 are cross section views of the backplane shown in FIG. 1, illustrating the various exemplary methodological steps that are used to make the backplane;

DETAILED DESCRIPTION

The following detailed description of the invention is merely exemplary in nature and is not intended to limit the invention or the application and uses of the invention. Furthermore, there is no intention to be bound by any theory presented in the preceding background of the invention or the following detailed description of the invention. In this regard, the display backplane described herein includes an array of thin-film transistors associated with each display pixel, which are used to control each pixel. However, the transistor may also be used in any other active matrix display devices such as organic light emitting displays and electrophoretic displays, for example.

Figure 1:
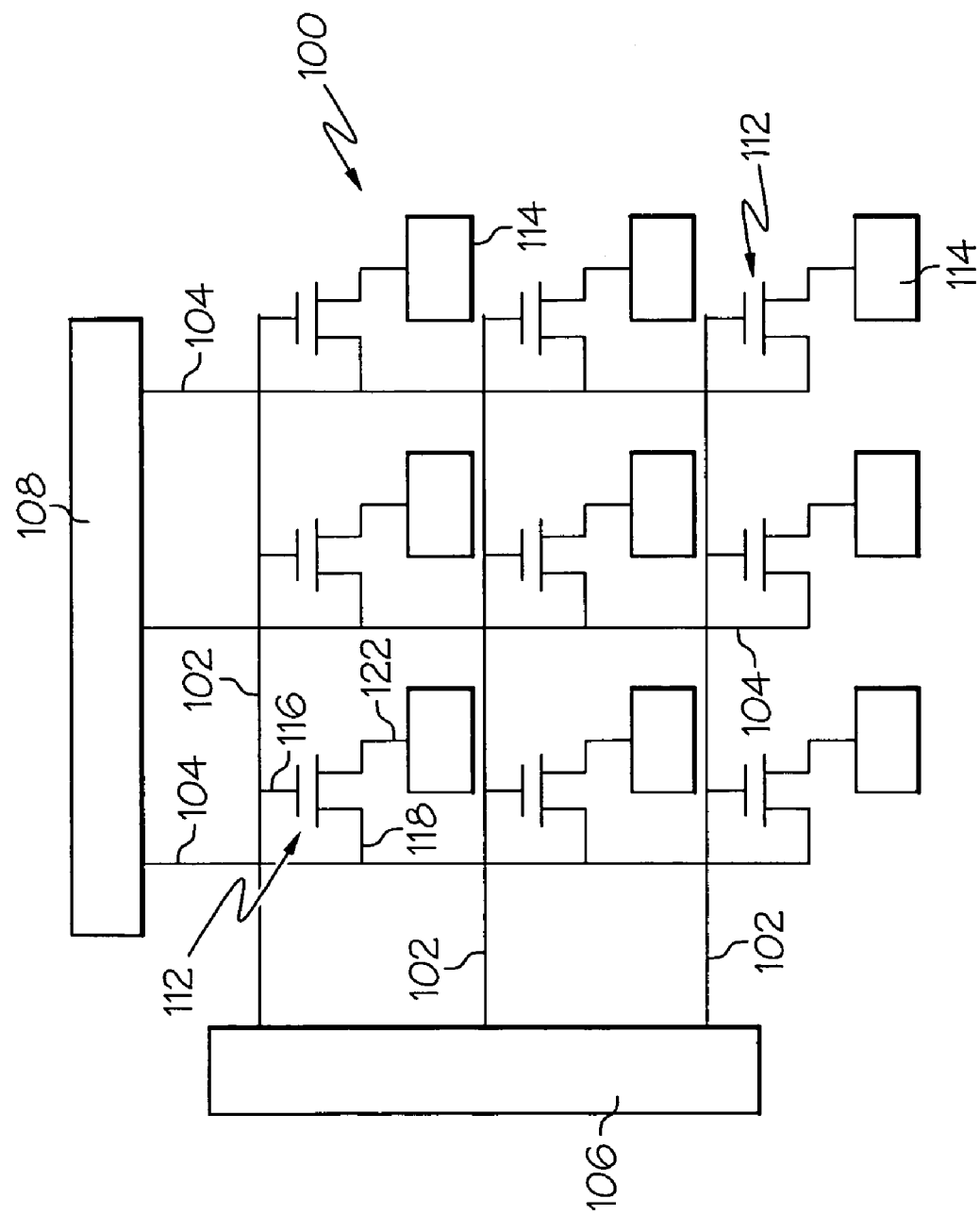
FIG. 1 is a schematic diagram of an exemplary embodiment of an active matrix display backplane.

A schematic diagram of an exemplary embodiment of an active matrix display backplane 100 is shown in FIG. 1, and includes a plurality of gate bus lines 102, a plurality of data bus lines 104, a gate driver circuit 106, a data driver circuit 108, a plurality of thin-film-transistors (TFTs) 112, and a plurality of pixel electrodes 114. The gate bus lines 102 and data bus lines 104 are each connected to the gate driver circuit 106 and the data driver circuit 108, respectively, and receive gate drive signals and input data signal voltages supplied respectively therefrom.

The TFTs 112 each include a gate terminal 116, a source terminal 118, and a drain terminal 122, and are each coupled to one of the gate bus lines 102, one of the data bus lines 104, and one of the pixel electrodes 114. In the depicted embodiment, the gate terminal 116 of each TFT 112 is connected to one of the gate bus lines 102, the source terminal 118 of each TFT 112 is connected to one of the data bus lines 104, and the drain terminal 122 of each TFT 112 is connected to one of the pixel electrodes 114. Thus, when the gate driver circuit 106 supplies a gate select drive signal, via one or more gate bus lines 102, to one or more of the gate terminals 116, the associated TFTs 112 are turned on. As a result, the input signal voltages supplied from data driver circuit 108 to the data bus lines 104 associated with the turned-on TFTs 112 are supplied to the associated pixel electrodes 114, thereby controlling light emission from the associated display pixel (not shown).

Figure 2:
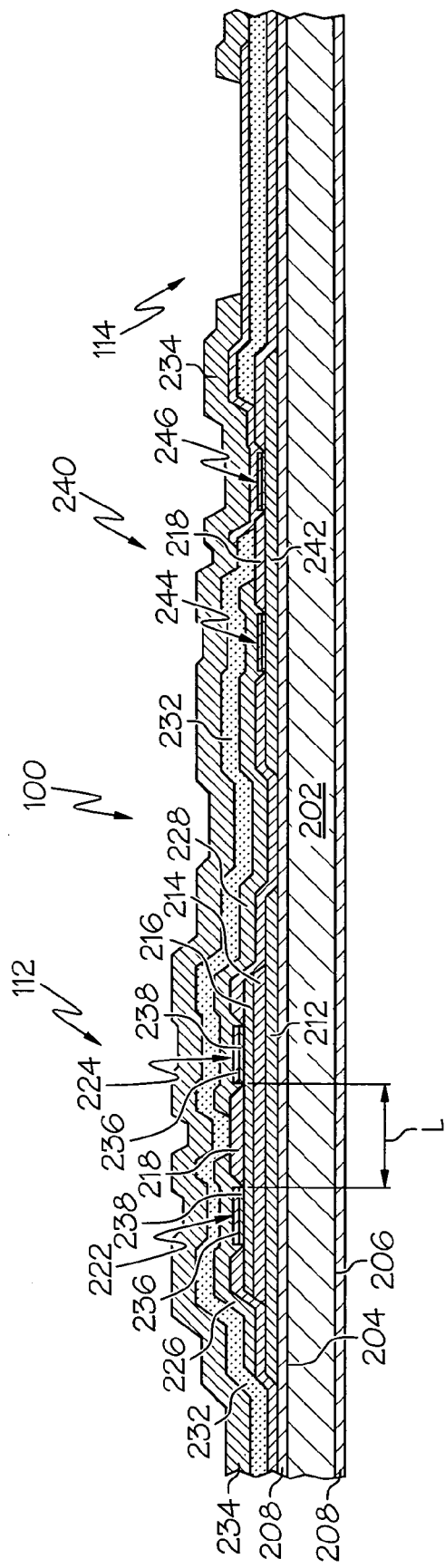
FIG. 2 is a cross section view of a portion of the backplane shown in FIG. 1.

Turning now to FIG. 2, a cross section view of a portion of the backplane 100, illustrating one of the TFTs 112 and one of the pixel electrodes 114 in more detail, is shown and will be described. As shown in FIG. 2, the TFT 112 and pixel electrode 114 are each formed on a flexible substrate 202. The flexible substrate 202, which includes a first surface 204 and a second surface 206, is preferably comprised of a flexible dielectric material such as, for example, plastic. In a particular preferred embodiment, the flexible dielectric material is polyethylene napthalate (PEN), though it will be appreciated that it could be any one of numerous other flexible dielectric materials now known or developed in the future. No matter how the specific flexible dielectric material of which the flexible substrate 202 is formed, before the TFTs 112 or pixel electrodes 114 are formed on its first surface 204, the flexible substrate 202 is annealed. The annealed flexible substrate 202 is dimensionally more stable than a non-annealed flexible substrate. As a result, the previously mentioned thermal stress that may arise from thermal expansion differences between the flexible substrate 202, the TFT 112, and pixel electrode 114, are significantly reduced. A more detailed description of a preferred substrate annealing process will be described further below.

The TFT 112 and pixel electrode 114, as was noted above, are formed on the first surface 204 of the annealed flexible dielectric substrate 202. Preferably, before doing so, the first 204 and second 206 surfaces are coated with a layer of a dielectric 208. In the depicted embodiment, the TFT 112 includes a gate electrode 212, a gate dielectric layer 214, an amorphous silicon (a-Si) layer 216, an inter-metal dielectric layer 218, a source contact 222, a drain contact 224, a source electrode 226, a drain electrode 228, a passivation layer 232, and a dielectric overcoat layer 234. The gate electrode 212, which is formed of a conductive material, is electrically equivalent to, and functions as, the gate terminal 116 shown in FIG. 1. Similarly, the source 226 and drain 228 electrode layers are each electrically equivalent to, and function as, the source 118 and drain 122 terminals, respectively, that are illustrated in FIG. 1.

As is generally known, the length (L) of that portion of the inter-metal dielectric layer 218 disposed between the source 222 and drain 224 contacts defines the channel length of the TFT 112. Moreover, the a-Si layer 216 functions as the TFT channel, through which charge carriers travel between the source contact 222 and drain contact 224. The source 222 and drain contacts 224, as will be described in more detail further below, are each preferably formed from a contact enhancement layer 236 and a barrier layer 238. The contact enhancement layer 236 improves TFT performance by, for example, reducing the threshold voltage and increasing the sub-threshold slope, and the barrier layer 238 functions as a stable metallic conductive layer and forming an ohmic contact with and protecting the underlying reactive contact enhancement layer 236.

The passivation layer 232 and the dielectric overcoat layer 234 are formed over the TFT 112 and portions of the pixel electrode 114 to provide passivation and/or protection of these devices. More specifically, in the depicted embodiment it is seen that the passivation layer 232 is formed over the TFT 112, and the dielectric overcoat layer 234 is formed over the passivation layer 232 and a portion of the pixel electrode 114.

As FIG. 2 also shows, in the depicted embodiment the pixel electrode 114 is electrically coupled to the drain electrode 228 via an interconnect 240. The interconnect 240 includes a conductor 242, an interconnect contact 244, a pixel electrode contact 246, and a portion of the inter-metal dielectric layer 218. The interconnect conductor 242, as will be described in more detail further below, is preferably formed at the same time, of the same material, and with the same thickness as the gate electrode 212. In addition, as will also be described in more detail further below, the interconnect contact 244 and the pixel electrode contact 246, are both formed at the same time, of the same material, and with the same thicknesses as the source 222 and drain 224 contacts.

Having described an embodiment of a display backplane 100 from a structural standpoint, a particular preferred process of forming the described backplane 100 will now be described. In doing so reference should be made, as appropriate, to FIGS. 3-11. It will be appreciated that, for clarity and ease of explanation, the process will be depicted and described using a simplified cross section view, similar to that shown in FIG. 2. It will additionally be appreciated that although the method is, for convenience, described using a particular order of steps, the method could also be performed in a different order or using different types of steps than what is described below. Moreover, although the method is described with respect to a single TFT 112, a single pixel electrode 114, and a single interconnect 240, it will be appreciated that a plurality of TFTs 112, pixel electrodes 114, and interconnects 240 may be formed on the same substrate 202.

Figure 3:
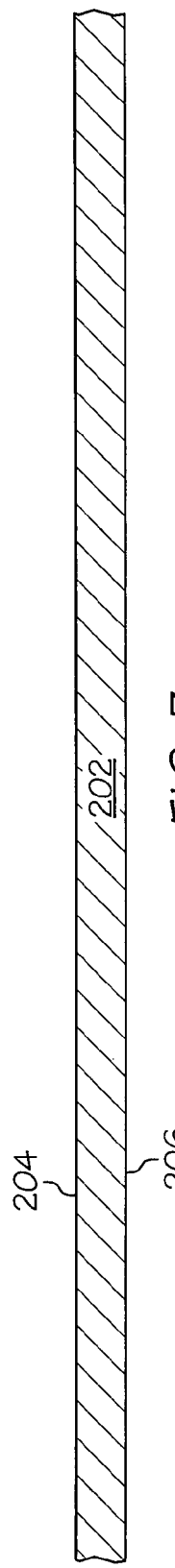

With the above background in mind, and with reference first to FIG. 3, it is seen that the starting material for the backplane 100 is the substrate 202. As was noted above, the substrate 202 is preferably formed of a flexible dielectric material, and is annealed at or near its maximum processable temperature to improve its dimensional stability throughout the remaining process steps. In the depicted embodiment, in which the substrate 202 is formed of PEN, the substrate is annealed in an environment having a temperature of about 180° C. and a vacuum of about 1 milliTorr (mTorr) for about 16 hours. It will be appreciated that this temperature-pressure-time profile is merely exemplary, and that it may vary depending, for example, on the particular flexible dielectric material used for the substrate 202. However, this particular temperature-pressure-time profile for a PEN substrate results in less than 25 ppm shrinkage during the remaining process steps.

Before proceeding further, it is noted that the subsequent process steps include various film deposition and photolithography processes. Thus; although not depicted, it will be appreciated that during the subsequent film deposition processes, the outer periphery of the flexible substrate 202 (e.g., about 0.1" from the substrate edge) is held with a picture frame type fixture to hold the substrate 202 substantially flat during film deposition. Moreover, though also not depicted, during the photolithography processes the substrate 202 is held flat either by use of a vacuum chuck or by temporarily attaching the substrate 202 to a glass substrate (not shown) with a surfactant, such as a thin layer of water, between the glass and the substrate 202. In addition, though also not depicted, while the substrate 202 is relatively dimensionally stable after annealing and barrier coating, in between process steps, the substrate 202 is preferably stored in a moisture free environment such as, for example, a nitrogen purged glove box. This is preferably done to minimize dimensional changes that could potentially occur due to moisture absorption.

Returning once again to a description of the backplane formation method, and with reference now to FIG. 4, it is seen that after the annealing process, and before any of the thin-film processing steps, the annealed flexible dielectric substrate 202 is coated with the dielectric material 208 on both its first 204 and second 206 sides. In the depicted embodiment, the dielectric 208 is SiNx that is deposited to a thickness of about 3000 Å. Although the dielectric 208 may be deposited (or otherwise formed) using any one of numerous deposition (or formation) processes, in the depicted embodiment the dielectric material 208 is deposited using a plasma enhanced chemical vapor deposition (PECVD) process.

Once the annealed flexible dielectric substrate 202 is coated with the dielectric 208, the thin-film processing steps begin. Initially, as is shown in FIG. 5, the gate electrode 212 and interconnect conductor 242 are simultaneously formed on the substrate first surface 204, over the dielectric 208. Preferably, the gate electrode 212 and interconnect conductive material layer 242 are formed by depositing any one of numerous types of electrically conductive materials, which are now known or may be developed in the future, to a suitable thickness. In the depicted embodiment, the gate electrode 212 and interconnect conductor 242 are formed by sputter depositing NiCr to a thickness of about 1500 Å, and patterning and etching the deposited NiCr using conventional photolithography techniques, such as an etch-back or a lift-off photolithography technique, both of which are described in more detail further below. No matter the specific photolithography technique that is used, upon completion the photoresist layer (not illustrated) is stripped from the substrate 202. Though not shown in FIG. 5, it will be appreciated that the gate electrode 212 may be patterned to include a gate bus line 102 as part of the same patterning process.

With continued reference to FIG. 5, it is seen that after the gate electrode 212 and interconnect conductor 242 are formed, the gate dielectric layer 214 and the a-Si layer 216 are formed over the gate electrode 212. In the depicted embodiment, the gate dielectric layer 214 and the a-Si layer 216 are both deposited using a PECVD process at about 160° C., and patterned and etched to the appropriate geometry. However, it will be appreciated that this is merely exemplary and that any one of numerous other processes may be used to form these layers 214, 216. Moreover, although the dielectric layer 214 may comprise any one of numerous dielectric materials of varying thicknesses, in the depicted embodiment the gate dielectric material is SiNx that is deposited to a thickness of about 2500 Å. Similarly, the a-Si layer 216 may be deposited to varying thicknesses, but in the depicted embodiment it is deposited to a thickness of about 1000 Å.

The gate dielectric layer 214 and the a-Si layer 216 are, at least in the depicted embodiment, sequentially deposited as part of a single deposition process. However, it will be appreciated that this is merely exemplary, and that these layers 214, 216 could instead be independently deposited via two separate deposition processes. Additionally, depending on the particular design of the TFT 112, the gate dielectric layer 214 and/or the a-Si layer 216 may be patterned and etched to define any one of numerous device geometries. In the depicted embodiment, the gate dielectric layer 214 and a-Si layer 216 are aligned with one another, and together form an island that is centrally disposed over the gate electrode 212.

Turning now to FIG. 6, it is seen that once the gate dielectric layer 214 and a-Si layer 216 are formed, the inter-metal dielectric layer 218 is then formed. The inter-metal dielectric layer 218 may comprise any one of numerous dielectric materials, and may be formed (or deposited) to varying thicknesses. However, in the depicted embodiment, the inter-metal dielectric layer 218 comprises SiNx having a thickness of about 3000 Å. The inter-metal dielectric layer 218 may additionally be formed using any one of numerous know formation or deposition techniques. In the depicted embodiment, however, the inter-metal dielectric layer 218 is formed using a technique that combines PECVD and a "partial" etch-back photolithography process. Before describing the "partial" etch-back photolithography process in more detail, for completeness a conventional etch-back photolithography process and a conventional lift-off photolithography process will each first be described.

As is generally known, with a conventional etch-back photolithography process, a material layer is deposited (or otherwise formed) on a surface of a substrate or other material layer. A layer of photoresist is then deposited over the deposited material layer. The photoresist layer is then patterned using photolithography, which removes selected portions of the photoresist layer and exposes portions of the underlying material layer. Then, using the remaining photoresist layer as a mask, the exposed portions of the underlying material layer are etched away. The remaining photoresist layer/mask is then removed.

With a conventional lift-off photolithography process, a layer of photoresist is first deposited on a surface. The photoresist layer is then patterned using photolithography, which removes selected portions of the photoresist layer and exposes portions of the underlying surface. The remaining photoresist layer then functions as a mask during subsequent material deposition. Thereafter, a material layer is deposited on the photoresist layer/mask and on the exposed portions of the underlying surface. Once the material layer has been deposited, the photoresist layer/mask and those portions of the material layer deposited on the photoresist layer/mask are chemically "lifted off," leaving the material layer on the exposed portions of the surface. Thus, with this photolithography technique the photoresist layer/mask is sometimes referred to as a lift-off mask.

Returning once again to the description, it was noted above that the inter-metal dielectric layer 218 is formed using PECVD and a "partial" etch-back photolithography process. As used herein, this means that the photoresist layer/mask (not shown in FIG. 6) is not removed after the inter-metal dielectric layer 218 is etched. Thus, following the etch of the deposited inter-metal dielectric layer 218, the photoresist layer/mask remains in place and is used as a lift-off mask during subsequent photolithography processes, which are described in more detail below. In any case, as is shown in FIG. 6, the photoresist layer that is used during inter-metal dielectric layer deposition is patterned to include four contact via—a source contact via 602, a drain contact via 604, an interconnection contact via 606, and a pixel electrode contact via 608. As will now be described, the source contact 222, the drain contact 224, the interconnection contact 244, and the pixel electrode contact 246 are each formed in the source contact via 602, the drain contact via 604, the interconnection contact via 606, and the pixel electrode contact via 608, respectively.

Figure 7:
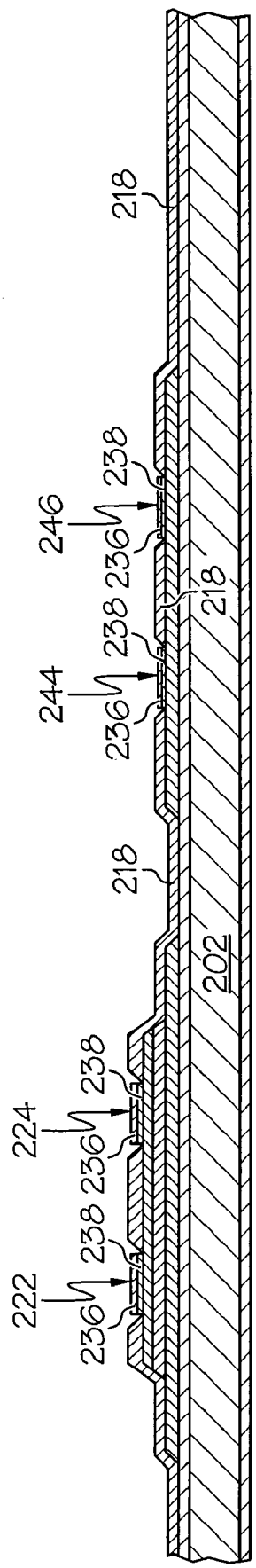

The source contact 222, the drain contact 224, the interconnection contact 244, and the pixel electrode contact 246, as was previously noted, each comprise a contact enhancement layer 236 and a barrier layer 238. Referring now to FIG. 7, it is seen that the contact enhancement layer 236 and barrier layer 238 are sequentially deposited over the intermetal dielectric layer 218 using, for example, a thermal evaporation process and the photoresist layer/mask from the previous step as a lift-off mask. In the depicted embodiment, the contact enhancement layer 236 and barrier layer 238 preferably comprise 700 Å thick layers of Yb and NiCr, respectively, though other materials and thicknesses could be used. In any event, following the deposition (or formation) of these layers 236, 238, the lift-off mask is then removed using any one of numerous known methods. In the depicted embodiment, the lift-off mask is removed in an ultrasonic acetone bath.

Figure 8:
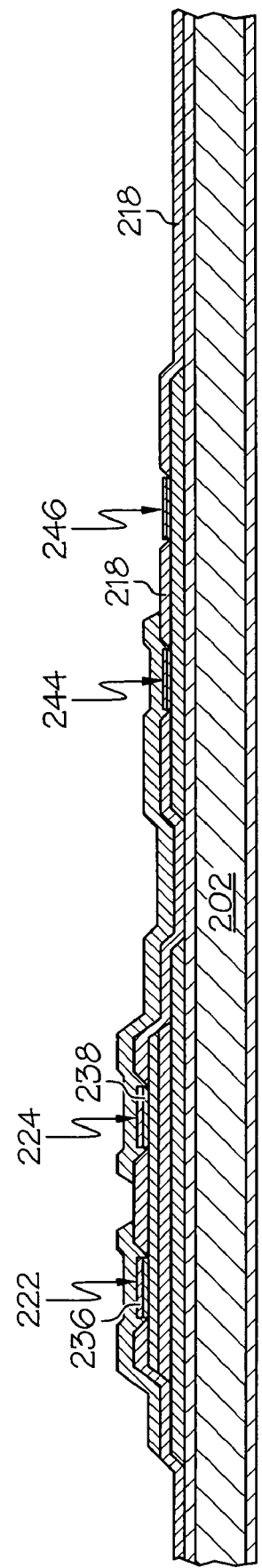

Once the source contact 222, the drain contact 224, the interconnection contact 244, and the pixel electrode contact 246 have each been formed, and as shown in FIG. 8, the source 226 and drain 228 electrodes are formed. To do so, a single layer of conductive material, such as aluminum, is deposited, patterned, and etched using any one of numerous material deposition methods and photolithography techniques now known or developed in the future. In the depicted embodiment, the aluminum layer is deposited using a sputtering technique, which is then patterned and etched using the above-described etch-back photolithography technique. No matter the specific techniques employed, it will be appreciated that the thickness to which the aluminum layer is deposited may vary, but in the depicted embodiment the aluminum is deposited to a thickness of about 4000 Å. As FIG. 8 shows, after the photoresist has been patterned and the aluminum layer has been etched, the source electrode 226 is electrically coupled to, and extends over, the source contact 222, and the drain electrode 228 is electrically coupled to, and extends over and between, the drain contact 224 and the interconnection contact 244. The pixel electrode contact 246, however, remains exposed.

After the source electrode 226 and drain electrode 228 have been formed, the passivation layer 232 is formed. As FIG. 9 shows, the passivation layer 232, when formed, extends over the TFT 112 and a portion of the interconnect 240. The passivation layer 232, like each of the previous layers described herein, may comprise any one of numerous dielectric materials and may have any one of numerous thicknesses. Moreover, the passivation layer 232 may be formed using any one of numerous material deposition methods and photolithography techniques now known or developed in the future. In the depicted embodiment, the passivation layer 232 comprises SiNx, and is deposited to a thickness of about 3600 Å using PECVD. In addition, the passivation layer 232 is preferably patterned and etched using the above-described "partial" etch-back photolithography technique. Thus, after the deposited passivation layer 232 has been etched, the photoresist layer/mask is not removed and is used as the lift-off mask for the subsequent photolithography process, which will now be described.

With continued reference to FIG. 9, it is seen that the photoresist layer (not shown) used during passivation layer deposition is patterned to also include a pixel electrode contact via 902. Thus, the pixel electrode contact 246 remains exposed. As a result, and with reference now to FIG. 10, when the pixel electrode 114 is subsequently formed, it is electrically coupled to the pixel electrode contact 246. The pixel electrode 114 is thus electrically coupled to the TFT drain electrode 228 via the pixel electrode contact 246, the interconnect conductor 242, and the interconnect contact 244.

The pixel electrode 114 is formed by depositing a suitable material layer over the pixel electrode contact 246 and portions of the passivation layer 232 using, for example, a sputtering process and the photoresist layer/mask from the previous step as the lift-off mask. The pixel electrode 114 may comprise any one of numerous suitable materials now known or developed in the future, and may be deposited to any one of numerous suitable thicknesses. In the depicted embodiment, the pixel electrode 114 comprises indium-tin-oxide (ITO), and is deposited to a thickness of about 1000 Å. Following the deposition (or formation) of the pixel electrode 114, the lift-off mask is removed in an ultrasonic acetone bath, though it will be appreciated that it could be removed using any one of numerous other methods now known or developed in the future.

Figure 11:
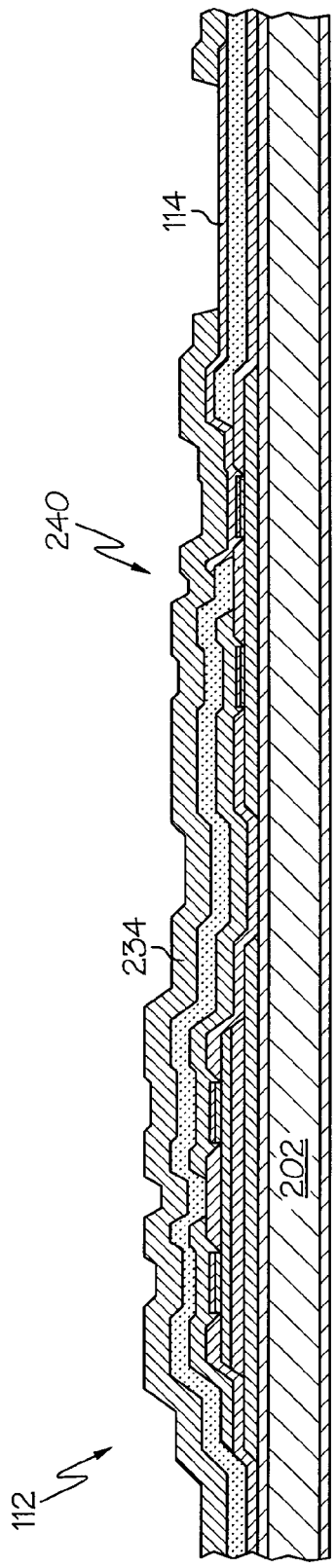

After the pixel electrode 114 is formed, the dielectric overcoat layer 234 is formed. To do so, a layer of dielectric material is deposited, patterned, and etched using any one of numerous material deposition methods and photolithography techniques now known or developed in the future. In the depicted embodiment, the dielectric material layer is deposited using a PE CVD technique, and the deposited dielectric material layer is patterned and etched using the above-described etch-back photolithography technique. No matter the specific techniques employed, the material and thickness of the dielectric layer may vary, but in the depicted embodiment the material comprises SiNx, and is deposited to a thickness of about 3600 Å. As FIG. 11 shows, after the photoresist has been patterned and the overcoat layer 234 has been etched, a portion of the pixel electrode 114 remains uncovered.

Figure 12:
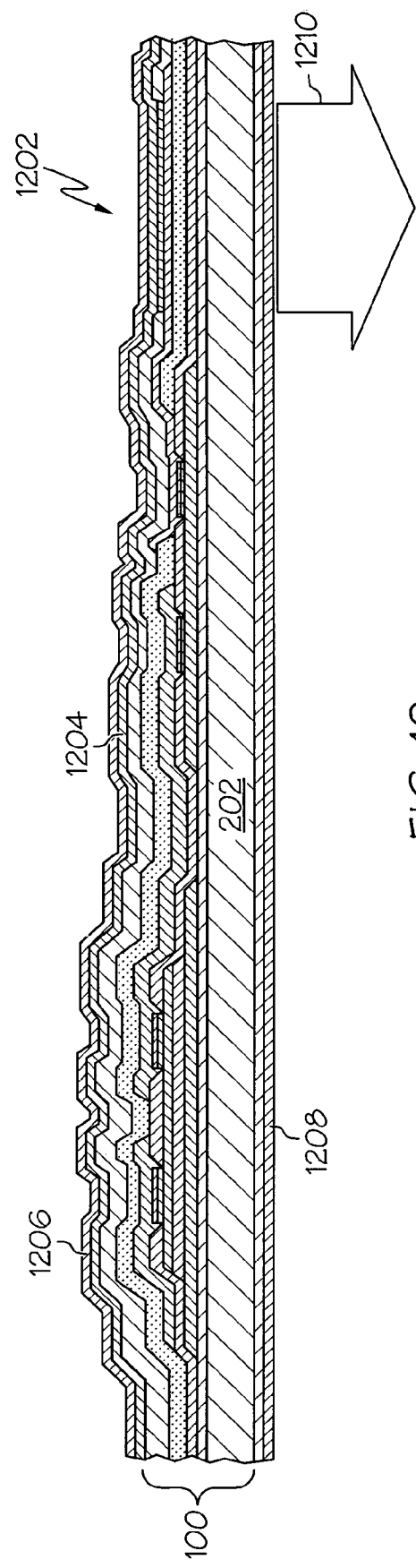
FIG. 12 is a cross section view of an exemplary embodiment of a portion of an active matrix OLED (organic light emitting diode) display fabricated using the flexible active matrix backplane of FIG. 11.

The flexible backplane 100 manufactured using the above described process is ready for additional display fabrication. For example, as is shown in FIG. 12, the flexible backplane 100 of FIG. 2 is integrated with an organic light emitting diode (OLED) structure stack 1202, a cathode layer 1204, and additional thin film encapsulation layers 1206 and 1208 to complete the fabrication of a flexible active matrix OLED display with a bottom emission 1210 architecture. The OLED structure stack 1202 is preferably fabricated using well known inkjet printing techniques or masked vacuum evaporation techniques for fabricating either polymer OLED device structures or small molecule OLED device structures on the active matrix backplane 100. The cathode layer 1204 is preferably a low work function cathode material that is preferably deposited via any one of numerous thermal evaporation techniques. The thin film encapsulation layers 1206 and 1208 may be deposited using any of numerous known techniques such as CVD, sputtering, atomic layer deposition, and may comprise any one of numerous appropriate barrier materials that prevent moisture and oxygen ingression, to thereby enhance OLED lifetime. It will be appreciated that the active matrix backplane 100 of FIG. 2 may also be used to fabricate flexible OLED displays with top emission OLED architectures and other reflective, transmissive flexible displays using electrophoretic or liquid crystal display media.

Figure 13:
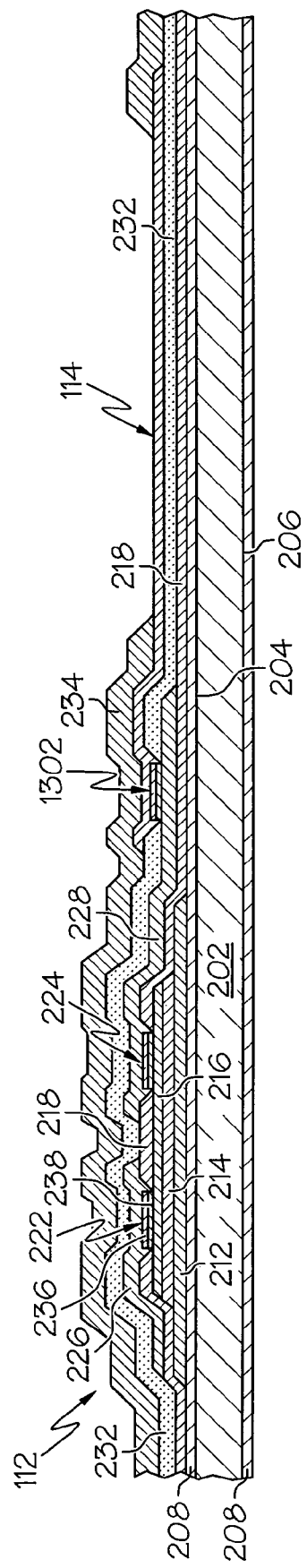
FIG. 13 is a cross section view of a portion of the backplane shown in FIG. 1 according to an alternative embodiment of the present invention.

It will be appreciated that the above method of forming and electrically interconnecting a TFT 112 and pixel electrode 114 on a flexible dielectric substrate 202 is merely exemplary, and that the TFT 112 and pixel electrode 114 could be electrically interconnected without using the interconnect 240. For example, in an alternative embodiment shown in FIG. 13, the TFT 112 and pixel electrode 114 are electrically interconnected by forming a pixel electrode contact 1302 directly on the drain electrode 228.

The flexible backplane 100 manufactured according to the method described herein provides enhanced dimensional stability, thereby substantially eliminating potential layer to layer misalignment and minimizing thermal stresses that may arise from mismatches in the coefficients of thermal expansion (CTE) between the substrate and deposited material layers. The described method additionally minimizes or eliminates curling and warping of the substrate, which may occur during manufacturing.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A method of forming an active matrix display backplane on a flexible dielectric substrate, comprising the steps of:
    forming a gate layer on a surface of the flexible dielectric substrate;
    forming a gate dielectric layer over the gate layer;
    forming an amorphous silicon (a-Si) layer over at least a portion of the gate dielectric layer;
    forming an inter-metal dielectric layer over the a-Si layer;
    selectively removing portions of the intermetallic dielectric layer to thereby expose at least a source contact region and a drain contact region on the a-Si layer;
    forming a source contact in the source contact region; and
    forming a drain contact in the drain contact region.

2. The method of claim 1, further comprising:
    annealing the flexible dielectric substrate.

3. The method of claim 2, wherein the step of annealing the flexible dielectric substrate comprises the steps of:
    heating the flexible dielectric substrate in an environment having a temperature of about 180° C. and a vacuum of about 1 milliTorr (mTorr) for about 16 hours.

4. The method of claim 1, wherein the flexible dielectric substrate comprises polyethylene naphthalate (PEN).

5. The method of claim 1, further comprising:
    forming a layer of silicon nitride (SiNx) dielectric barrier layer on the surface of the flexible dielectric substrate.

6. The method of claim 5, wherein the layer of SiNx is about 3000 Å in thickness.

7. The method of claim 6, wherein the step of forming the layer of SiNx comprises:
    depositing the SiNx on the surface of the flexible dielectric substrate using a plasma etch chemical vapor deposition (PECVD) processs.

8. The method of claim 1, wherein:
    the gate layer comprises nickel-chromium (NiCr); and
    the gate dielectric layer comprises silicon-nitride (SiNx).

9. The method of claim 8, wherein the step of forming the gate layer comprises:
    sputter depositing the NiCr over the deposited gate dielectric layer to a thickness in the range of about 1200 Å to about 1500 Å; and
    patterning and etching the gate layer via a photolithography process.

10. The method of claim 8, wherein the step of forming the gate dielectric layer comprises depositing the gate dielectric layer over at least the gate layer via a PECVD process.

11. The method of claim 10, wherein:
    the gate dielectric layer comprises silicon-nitride (SiNx); and
    the SiNx gate dielectric layer is deposited to a thickness of about 2500 Å.

12. The method of claim 11, wherein the step of forming the a-Si layer comprises the step of:
    depositing the a-Si to a thickness of about 1000 Å via a PECVD process,
    wherein the gate dielectric layer and the a-Si layer are deposited sequentially to thereby form a SiNx/a-Si layer.

13. The method of claim 12, further comprising patterning and etching the SiNx/a-Si layer.

14. The method of claim 1, wherein the step of forming the inter-metal dielectric layer comprises:
    depositing a layer of SiNx to a thickness of about 3000 Å via a PECVD process;
    depositing a photresist layer on the SiNx layer;
    patterning the photoresist layer to form a mask; and
    etching the SiNx inter-metal dielectric layer to thereby selectively remove portions thereof and expose the source contact region and the drain contact region on the a-Si layer.

15. The method of claim 14, wherein the step of forming the source contact and the drain contact comprises:
    depositing a contact enhancement layer on at least a portion of the photoresist layer, the source contact region, and the drain contact region; and
    lifting off the photoresist layer.

16. The method of claim 15, wherein the contact enhancement layer comprises ytterbium (Yb) deposited to a thickness of about 700 Å.

17. The method of claim 16, further comprising:
    depositing a barrier layer on at least a portion of the contact enhancement layer, before lifting off the photoresist layer.

18. The method of claim 17, wherein the barrier layer comprises NiCr deposited to a thickness of about 700 Å.

19. The method of claim 15, wherein the contact enhancement layer comprises phosphorous doped n+a-Si deposited to a thickness of about 500 Å.

20. The method of claim 1, further comprising:
    forming a layer of conductive material over the source and drain contacts; and
    selectively removing portions of the conductive material to thereby electrically insulate at least the source and drain electrodes from one another.

21. The method of claim 1, further comprising:
    forming a pixel electrode on the surface of the substrate, the pixel electrode electrically coupled to the drain contact.

22. The method of claim 21, wherein the pixel electrode comprises indium-tin-oxide (ITO) having a thickness of about 1000 Å.

23. The method of claim 1, further comprising:
    forming an interconnect conductor on the surface of the substrate;
    forming an interconnection contact and a pixel electrode contact on the interconnect conductor; and
    forming a pixel electrode over at least the pixel electrode contact.

24. The method of claim 23, further comprising:
    forming a layer of conductive material over the source contact, the drain contacts, the interconnection contact, and the pixel electrode contact; and selectively removing portions of the conductive material to thereby electrically insulate the source and drain electrodes from one another and electrically couple the drain contact to the interconnection contact.

25. The method of claim 24, further comprising:

forming a pixel electrode over at least the pixel electrode contact, whereby the pixel electrode is electrically coupled to the drain electrode via the interconnect conductor, the interconnection contact, and the conductive material.

26. The method of claim 24, wherein the pixel electrode is exposed when the portions of the conductive material are selectively removed, and wherein the method further comprises:

forming a passivation layer over the conductive material and the pixel electrode;

depositing a photresist layer on the passivation layer;

patterning the photoresist layer to form a mask; and etching the passivation layer to thereby selectively remove portions thereof and once again expose the pixel electrode.

27. The method of claim 26, further comprising:

forming a pixel electrode over the pixel electrode contact and a portion of the passivation layer, whereby the pixel electrode is electrically coupled to the drain electrode via the interconnect conductor, the interconnection contact, and the conductive material.

\* \* \* \* \*